United States Patent
Shabbir et al.

(10) Patent No.: US 11,009,924 B2
(45) Date of Patent: May 18, 2021

(54) SYSTEMS AND METHODS FOR COMBINED ACTIVE AND PASSIVE COOLING OF AN INFORMATION HANDLING RESOURCE

(71) Applicant: Dell Products L.P., Round Rock, TX (US)

(72) Inventors: Hasnain Shabbir, Round Rock, TX (US); Carlos Guillermo Henry, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 89 days.

(21) Appl. No.: 16/054,098

(22) Filed: Aug. 3, 2018

(65) Prior Publication Data

US 2020/0042052 A1 Feb. 6, 2020

(51) Int. Cl.
*G06F 1/20* (2006.01)
*H05K 7/20* (2006.01)

(52) U.S. Cl.
CPC ........... *G06F 1/20* (2013.01); *H05K 7/20809* (2013.01); *G06F 1/203* (2013.01); *G06F 1/206* (2013.01); *G06F 2200/201* (2013.01)

(58) Field of Classification Search
CPC .... G06F 1/203; G06F 1/206; G06F 2200/201; H05K 7/20809
USPC .......................................... 165/104.33, 80.3
See application file for complete search history.

(56) References Cited

U.S. PATENT DOCUMENTS

| 5,285,347 A | * | 2/1994 | Fox ........................... G06F 1/20 165/80.3 |
| 6,483,707 B1 | * | 11/2002 | Freuler ............... H01L 23/3737 156/346 |
| 2006/0032616 A1 | * | 2/2006 | Yang ..................... H01L 23/467 165/104.33 |
| 2006/0139880 A1 | * | 6/2006 | Tate .......................... G06F 1/20 361/697 |
| 2007/0127214 A1 | * | 6/2007 | Chen ................... H01L 23/4093 361/709 |
| 2013/0016290 A1 | * | 1/2013 | Takahashi .......... H05K 7/20972 348/836 |

* cited by examiner

Primary Examiner — Joel M Attey
(74) Attorney, Agent, or Firm — Jackson Walker L.L.P.

(57) ABSTRACT

Heat-rejecting media may thermally couple to a device, and the heat-rejecting media may include active heat-rejecting media configured to thermally couple to the device and thermally couple between the device and an active cooling system such that the active cooling system causes heat transferred to the active heat-rejecting media from the device to be transferred from the active heat-rejecting media and passive heat-rejecting media extending from the active heat-rejecting media and configured to thermally couple to the device and thermally couple between the device and a system-level air mover other than the active cooling system and configured to drive airflow to components of a system comprising the device such that the heat transferred to the passive heat-rejecting media from the device is transferred to the airflow driven by the system-level air mover.

9 Claims, 6 Drawing Sheets

SYSTEMS AND METHODS FOR COMBINED ACTIVE AND PASSIVE COOLING OF AN INFORMATION HANDLING RESOURCE

TECHNICAL FIELD

The present disclosure relates in general to information handling systems, and more particularly to a combined passive and active cooling of an information handling resource.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system comprising an air mover and heat sink local to (e.g., mounted or mechanically attached to) a component for cooling the component by driving air over the heat sink to cool the peripheral component. Another type of active cooling may include liquid cooling, in which a heat-exchanging cold plate is thermally coupled to the component, and a chilled fluid is passed through conduits internal to the cold plate to remove heat from the component.

While active cooling may provide a very efficient approach to cooling with high-velocity, high-impact airflow with very low air mover power consumption required for the local active air mover, there may be no cooling redundancy for the component in case of failure of the local air mover. Similarly, traditional liquid cooling solutions also do not provide cooling redundancy in the event of failure of the liquid cooling system (e.g., if a pump for conveying the cooling fluid to the cold plate fails).

SUMMARY

In accordance with the teachings of the present disclosure, the disadvantages and problems associated with lack of redundant cooling in traditional approaches to active cooling may be substantially reduced or eliminated.

In accordance with embodiments of the present disclosure, an information handling system may include a system-level air mover configured to drive airflow to components of the information handling system, an information handling resource, an active cooling system other than the system-level air mover for providing active cooling of the information handling resource, and heat-rejecting media thermally coupled to the information handling resource, the heat rejecting media comprising active heat-rejecting media thermally coupled to the information handling resource and thermally coupled between the information handling resource and the active cooling system such that the active cooling system causes heat transferred to the active heat-rejecting media from the information handling resource to be transferred from the active heat-rejecting media and passive heat-rejecting media extending from the active heat-rejecting media and thermally coupled to the information handling resource and thermally coupled between the information handling resource and the system-level air mover such that the heat transferred to the passive heat-rejecting media from the information handling resource is transferred to the airflow driven by the system-level air mover.

In accordance with these and other embodiments of the present disclosure, heat-rejecting media may be configured to be thermally coupled to an information handling resource, and the heat rejecting media may include active heat-rejecting media configured to thermally couple to the information handling resource and thermally couple between the information handling resource and an active cooling system such that the active cooling system causes heat transferred to the active heat-rejecting media from the information handling resource to be transferred from the active heat-rejecting media and passive heat-rejecting media extending from the active heat-rejecting media and configured to thermally couple to the information handling resource and thermally couple between the information handling resource and a system-level air mover other than the active cooling system and configured to drive airflow to components of an information handling system comprising the information handling resource such that the heat transferred to the passive heat-rejecting media from the information handling resource is transferred to the airflow driven by the system-level air mover.

In accordance with these and other embodiments of the present disclosure, a method for forming heat-rejecting media configured to be thermally coupled to an information handling resource, may include thermally coupling active heat-rejecting media to passive heat-rejecting media, such that the active heat-rejecting media is configured to thermally couple to the information handling resource and thermally couple between the information handling resource and an active cooling system such that the active cooling system causes heat transferred to the active heat-rejecting media from the information handling resource to be transferred from the active heat-rejecting media and the passive heat-rejecting media extends from the active heat-rejecting media and is configured to thermally couple to the information handling resource and thermally couple between the information handling resource and a system-level air mover other than the active cooling system and configured to drive airflow to components of an information handling system comprising the information handling resource such that the heat transferred to the passive heat-rejecting media from the information handling resource is transferred to the airflow driven by the system-level air mover.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
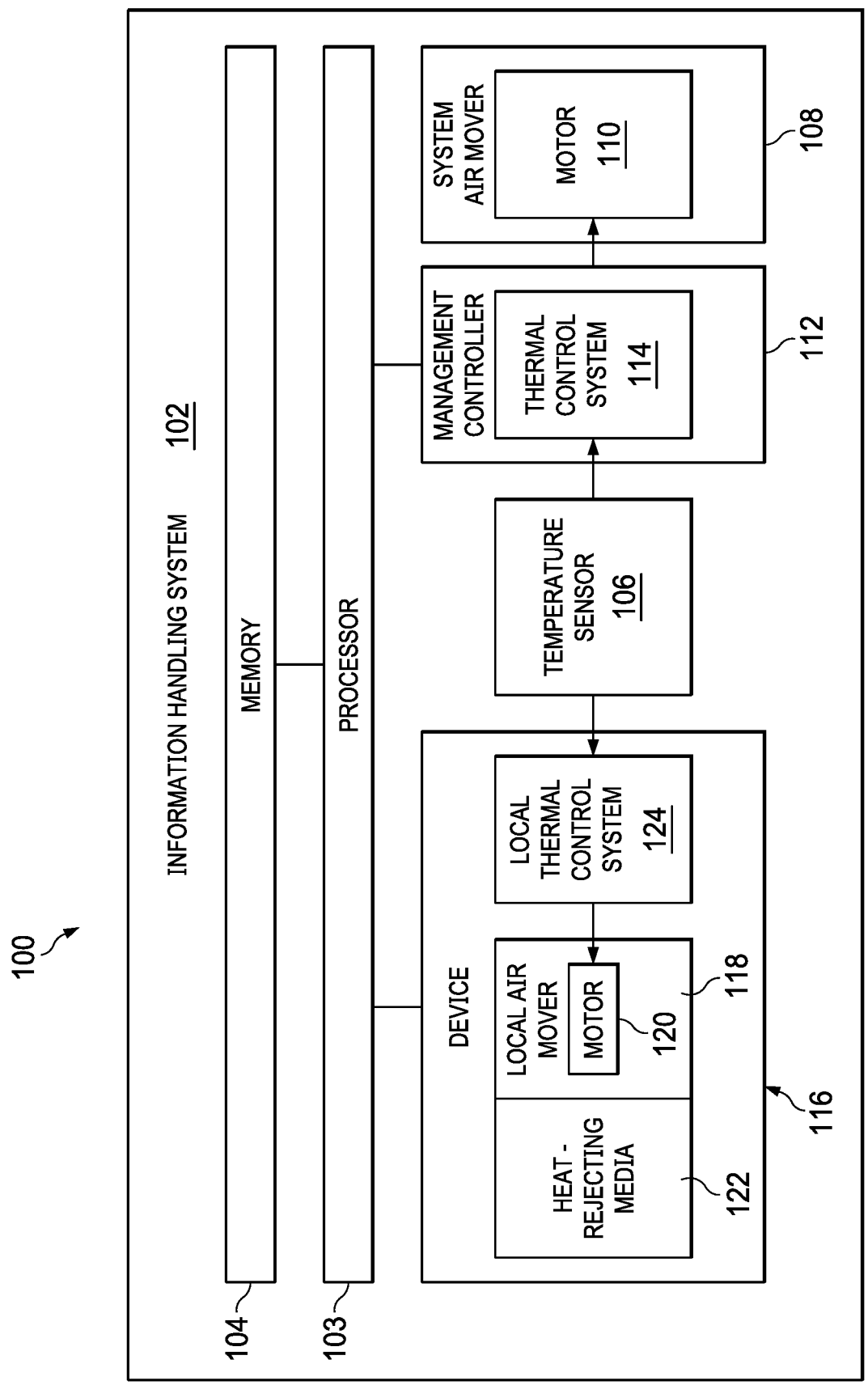
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, a system air mover 108, a management controller 112, and a device 116.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

System air mover 108 may include any mechanical or electro-mechanical system, apparatus, or device operable to move air and/or other gases in order to cool information handling resources of information handling system 102. In some embodiments, system air mover 108 may comprise a fan (e.g., a rotating arrangement of vanes or blades which act on the air). In other embodiments, system air mover 108 may comprise a blower (e.g., a centrifugal fan that employs rotating impellers to accelerate air received at its intake and change the direction of the airflow). In these and other embodiments, rotating and other moving components of system air mover 108 may be driven by a motor 110. The rotational speed of motor 110 may be controlled by an air mover control signal communicated from thermal control system 114 of management controller 112. In operation, system air mover 108 may cool information handling resources of information handling system 102 by drawing cool air into an enclosure housing the information handling resources from outside the chassis, expelling warm air from inside the enclosure to the outside of such enclosure, and/or moving air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to system air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirements information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages; electro-mechanical devices, displays, and power supplies.

Oftentimes, an architecture of information handling system 102 may be such that device 116 may be significantly downstream of system air mover 108 that it may be significantly more effective for device 116 to include an on-board local air mover 118 configured to drive air over heat-rejecting media 122 thermally coupled to individual components (e.g., processors, controllers, or other integrated circuits) of device 116. Local air mover 118 may include any mechanical or electro-mechanical system, apparatus, or device operable to move air and/or other gases in order to cool components of device 116. In some embodiments, local air mover 118 may comprise a fan. In these and other embodiments, rotating and other moving components of local air mover 118 may be driven by a motor 120. The rotational speed of motor 120 may be controlled by an air mover control signal communicated from a thermal control system 124 local to device 116.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, finstack, etc.) such that heat generated by the information handling resource is transferred from the information handling resource into air surrounding the information handling resource. For example, in the embodiments represented by FIG. 1, heat-rejecting media 122 may be thermally coupled to device 116 and arranged such that heat generated by device 116 is transferred to air driven by local air mover 118.

Local thermal control system 124 may include any system, device, or apparatus configured to receive one or more signals indicative of one or more temperatures associated with one or more components of device 116 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to local air mover 118.

In addition to processor 103, memory 104, temperature sensor 106, air mover 108, management controller 112, and device 116, information handling system 102 may include one or more other information handling resources. In addition, for the sake of clarity and exposition of the present disclosure, FIG. 1 depicts only one system air mover 108 and one device 116. In embodiments of the present disclosure, information handling system 102 may include any number of system air movers 108 and devices 116. Furthermore, for the sake of clarity and exposition of the present disclosure, FIG. 1 depicts device 116 including a local air mover 118 for active cooling of device 116. However, in some embodiments, approaches similar or identical to those used to actively cool device 116 as described herein may be employed to provide active cooling of processor 103, memory 104, management controller 112, and/or any other information handling resource of information handling system 102.

Figure 2:
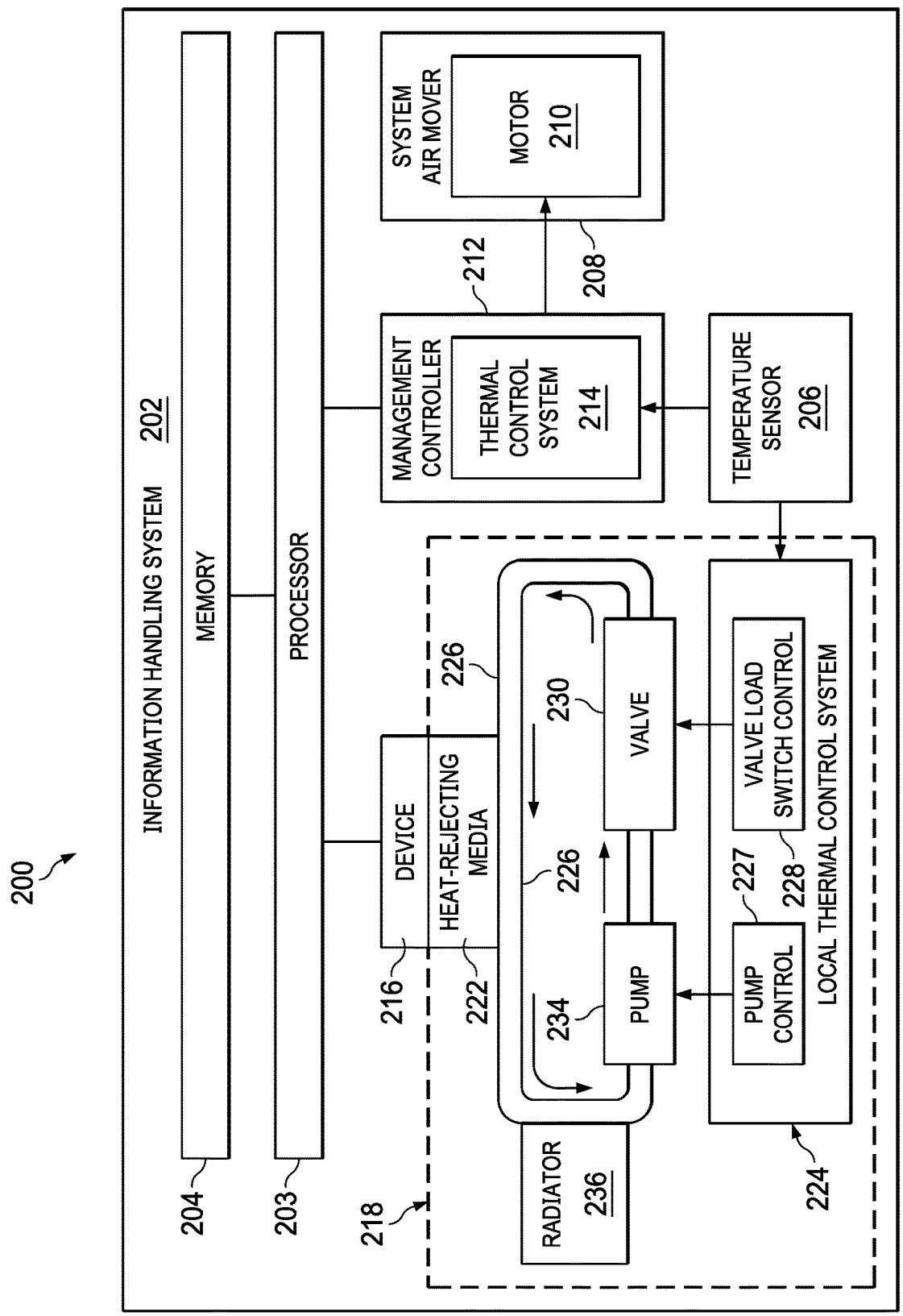
FIG. 2 illustrates a block diagram of another example information handling system, in accordance with embodiments of the present disclosure.

FIG. 2 illustrates a block diagram of an example information handling system 202, in accordance with embodiments of the present disclosure. In some embodiments, information handling system 202 may comprise a server chassis configured to house a plurality of servers or "blades." In other embodiments, information handling system 202 may comprise a personal computer (e.g., a desktop computer, laptop computer, mobile computer, and/or notebook computer). In yet other embodiments, information handling system 202 may comprise a storage enclosure configured to house a plurality of physical disk drives and/or other computer-readable media for storing data. As shown in FIG. 2, information handling system 202 may include a chassis 200 housing a processor 203, a memory 204, a temperature sensor 206, a system air mover 208, a management controller 212, a device 216, and an active liquid cooling system 218.

Processor 203 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 203 may interpret and/or execute program instructions and/or process data stored in memory 204 and/or another component of information handling system 202.

Memory 204 may be communicatively coupled to processor 203 and may comprise any system, device, or apparatus operable to retain program instructions or data for a period of time. Memory 204 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 202 is turned off.

System air mover 208 may include any mechanical or electro-mechanical system, apparatus, or device operable to move air and/or other gases in order to cool information handling resources of information handling system 202. In some embodiments, system air mover 208 may comprise a fan (e.g., a rotating arrangement of vanes or blades which act on the air). In other embodiments, system air mover 208 may comprise a blower (e.g., a centrifugal fan that employs rotating impellers to accelerate air received at its intake and change the direction of the airflow). In these and other embodiments, rotating and other moving components of system air mover 208 may be driven by a motor 210. The rotational speed of motor 210 may be controlled by an air mover control signal communicated from thermal control system 214 of management controller 212. In operation, system air mover 208 may cool information handling resources of information handling system 202 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 212 may comprise any system, device, or apparatus configured to facilitate management and/or control of information handling system 202 and/or one or more of its component information handling resources. Management controller 212 may be configured to issue commands and/or other signals to manage and/or control information handling system 202 and/or its information handling resources. Management controller 212 may comprise a microprocessor, microcontroller, DSP, ASIC, field programmable gate array ("FPGA"), EEPROM, or any combination thereof. Management controller 212 also may be configured to provide out-of-band management facilities for management of information handling system 202. Such management may be made by management controller 212 even if information handling system 202 is powered off or powered to a standby state. In certain embodiments, management controller 212 may include or may be an integral part of a baseboard management controller (BMC), a remote access controller (e.g., a Dell Remote Access Controller or Integrated Dell Remote Access Controller), or an enclosure controller. In other embodiments, management controller 212 may include or may be an integral part of a chassis management controller (CMC).

As shown in FIG. 2, management controller 212 may include a thermal control system 214. Thermal control system 214 may include any system, device, or apparatus configured to receive one or more signals indicative of one or more temperatures within information handling system 202 (e.g., one or more signals from one or more temperature sensors 206), and based on such signals, calculate an air mover driving signal to maintain an appropriate level of cooling, increase cooling, or decrease cooling, as appropriate, and communicate such air mover driving signal to system air mover 208. In these and other embodiments, thermal control system 214 may be configured to receive information from other information handling resources and calculate the air mover driving signal based on such received information in addition to temperature information. For example, as described in greater detail below, thermal control system 214 may receive configuration data from device 216 and/or other information handling resources of information handling system 202, which may include thermal requirements information of one or more information handling resources. In addition to temperature information collected from sensors within information handling system 202, thermal control system 214 may also calculate the air mover driving signal based on such information received from information handling resources.

Temperature sensor 206 may be any system, device, or apparatus (e.g., a thermometer, thermistor, etc.) configured to communicate a signal to processor 203 or another controller indicative of a temperature within information handling system 202. In many embodiments, information handling system 202 may comprise a plurality of temperature sensors 206, wherein each temperature sensor 206 detects a temperature of a particular component and/or location within information handling system 202.

Device 216 may comprise any component information handling system of information handling system 202, including without limitation processors, buses, memories, I/O devices and/or interfaces, storage resources, network interfaces, motherboards, integrated circuit packages; electro-mechanical devices, displays, and power supplies.

Oftentimes, an architecture of information handling system 202 may be such that device 216 may be significantly downstream of system air mover 208 that it may be significantly more effective for device 216 to be cooled using active liquid cooling system 218. As shown in FIG. 2, active liquid cooling system 218 may include a local thermal control system 224, heat-rejecting media 222, pump 234, radiator 236, valve 230, and fluidic conduits 226.

Local thermal control system 224 may be communicatively coupled to temperature sensor 206, and may include any system, device, or apparatus (e.g., a processor, controller, etc.) configured to control components of an active liquid cooling system for cooling a temperature of one or more information handling resources of information handling system 202. For example, local thermal control system 224 may be configured to control pump 234 and/or valve 230 based on thermal data sensed by temperature sensor 206, so as to maintain a safe operating temperature for one or more information handling resources. Accordingly, local thermal control system 224 may include a pump control subsystem 227 for controlling operation of pump 234 (e.g., a pressure applied to coolant fluid in conduits 226 for moving such fluid through conduits 226) and a valve load switch control subsystem 228 for controlling operation of valve 230 (e.g., opening or closing valve 230, controlling an aperture of valve 230, etc.).

Pump 234 may be fluidically coupled to one or more fluidic conduits 226 and may comprise any mechanical or electro-mechanical system, apparatus, or device operable to produce a flow of fluid (e.g., fluid in one or more conduits 226). For example, pump 234 may produce fluid flow by applying a pressure to fluid in fluidic conduits 226. As described above, operation of pump 234 may be controlled by pump control subsystem 227 which may control electro-mechanical components of pump 234 in order to produce a desired rate of coolant flow.

Radiator 236 may include any device, system or apparatus configured to transfer thermal energy from one medium (e.g., fluid within a fluidic conduit 226) to another (e.g., air external to chassis 200) for the purpose of cooling and heating. In some embodiments, radiator 236 may include fluidic channels and/or conduits in at least a portion of radiator 236. Such fluidic channels and/or conduits may be fluidically coupled to one or more of fluidic conduits 226 and pump 234.

Valve 230 may include any device, system or apparatus that regulates, directs, and/or controls the flow of a fluid (e.g., a coolant liquid in fluidic conduits 226) by opening, closing, or partially obstructing one or more passageways. When valve 230 is open, coolant liquid may flow in a direction from higher pressure to lower pressure. As described above, the operation of valve 230 (e.g., opening and closing, size of an aperture of valve 230) may be controlled by valve load switch control subsystem 228.

In operation, pump 234 may induce a flow of liquid (e.g., water, ethylene glycol, propylene glycol, or other coolant) through various fluidic conduits 226 of information handling system 102, valve 230 and/or radiator 236. As fluid passes by heat-rejecting media 222 in a fluidic conduit 226 proximate to device 216, heat may be transferred from device 216 to heat-rejecting media 222 and from heat-rejecting media to the liquid coolant in fluidic conduit 226. As such heated coolant flows by radiator 236, heat from the coolant may be transferred from the coolant to air ambient to chassis 200, thus cooling the fluid.

Heat-rejecting media 222 may include any system, device, or apparatus configured to transfer heat from an information handling resource (e.g., device 216, as shown in FIG. 2), thus reducing a temperature of the information handling resource. For example, heat-rejecting media 222 may include a solid thermally coupled to the information handling resource (e.g., heatpipe, heat spreader, heatsink, finstack, etc.) such that heat generated by the information handling resource is transferred from the information handling resource.

In addition to processor 203, memory 204, temperature sensor 206, air mover 208, management controller 212, device 216, and active liquid cooling system 218, information handling system 202 may include one or more other information handling resources. In addition, for the sake of clarity and exposition of the present disclosure, FIG. 2 depicts only one system air mover 208 and one device 216. In embodiments of the present disclosure, information handling system 202 may include any number of system air movers 208 and devices 216. Furthermore, for the sake of clarity and exposition of the present disclosure, FIG. 2 depicts device 216 including an active liquid cooling system 218 for active cooling of device 216. However, in some embodiments, approaches similar or identical to those used to actively cool device 216 as described herein may be employed to provide active cooling of processor 203, memory 204, management controller 212, and/or any other information handling resource of information handling system 202.

In addition, although FIG. 1 depicts an embodiment with active airflow cooling via a local air mover and FIG. 2 depicts an embodiment with active liquid cooling, it is understood that some embodiments may include both active airflow cooling on some devices and active liquid cooling on other devices and/or both active cooling and active liquid cooling on the same device(s).

In operation, a local thermal control system (e.g., local thermal control system 124, local thermal control system 224) may be able to detect the existence of a fault condition of the active cooling mechanism controlled by such local thermal control system. For example, with respect to active airflow cooling of device 116, local thermal control system 124 may be configured to detect a fault condition of local air mover 118 and report the existence of such fault condition to thermal control system 114. In some embodiments, a fault condition may be indicated by a temperature sensor internal to an information handling resource reporting a temperature unlikely to exist in the absence of a fault condition, a motion sensor (e.g., tachometer) indicating that motor 120 of local air mover 118 is moving at an insufficient speed to provide adequate cooling, and/or any other measurements or operational parameters indicating a fault condition.

As another example, with respect to active airflow cooling of device 216, local thermal control system 224 may be configured to detect a fault condition of valve 230 or pump 234 that indicates a problem in properly conveying cooling fluid within conduits 226, and report the existence of such fault condition to thermal control system 214. In some embodiments, a fault condition may be indicated by a temperature sensor internal to an information handling resource reporting a temperature unlikely to exist in the absence of a fault condition, a sensor indicating that valve 230 is not operating properly (e.g., a liquid flow rate monitor), a sensor indicating that pump 234 is not operating properly (e.g., a liquid flow rate monitor), and/or any other measurements or operational parameters indicating a fault condition.

In the absence of a fault condition, a system-level thermal control system (e.g., thermal control system 114, thermal control system 214) may ignore thermal conditions associated with an actively-cooled device (e.g., device 116, device 216), trusting the active cooling system to provide adequate cooling. However, in the presence of a fault condition in an active cooling system, a system-level thermal control system may need to take over cooling of the device and may thus monitor thermal conditions associated with the device to ensure adequate airflow is provided by a system air mover (e.g., system air mover 108, system air mover 208) to provide adequate cooling of the device.

One disadvantage of existing approaches to active cooling is that device assemblies (e.g., including the device and its associated heat-rejecting media) for active-cooled solutions do not have form factors that are well-suited for passive cooling. Accordingly, the solutions described below with respect to FIGS. 3 and 4 may reduce or eliminate such disadvantages.

Figure 3:
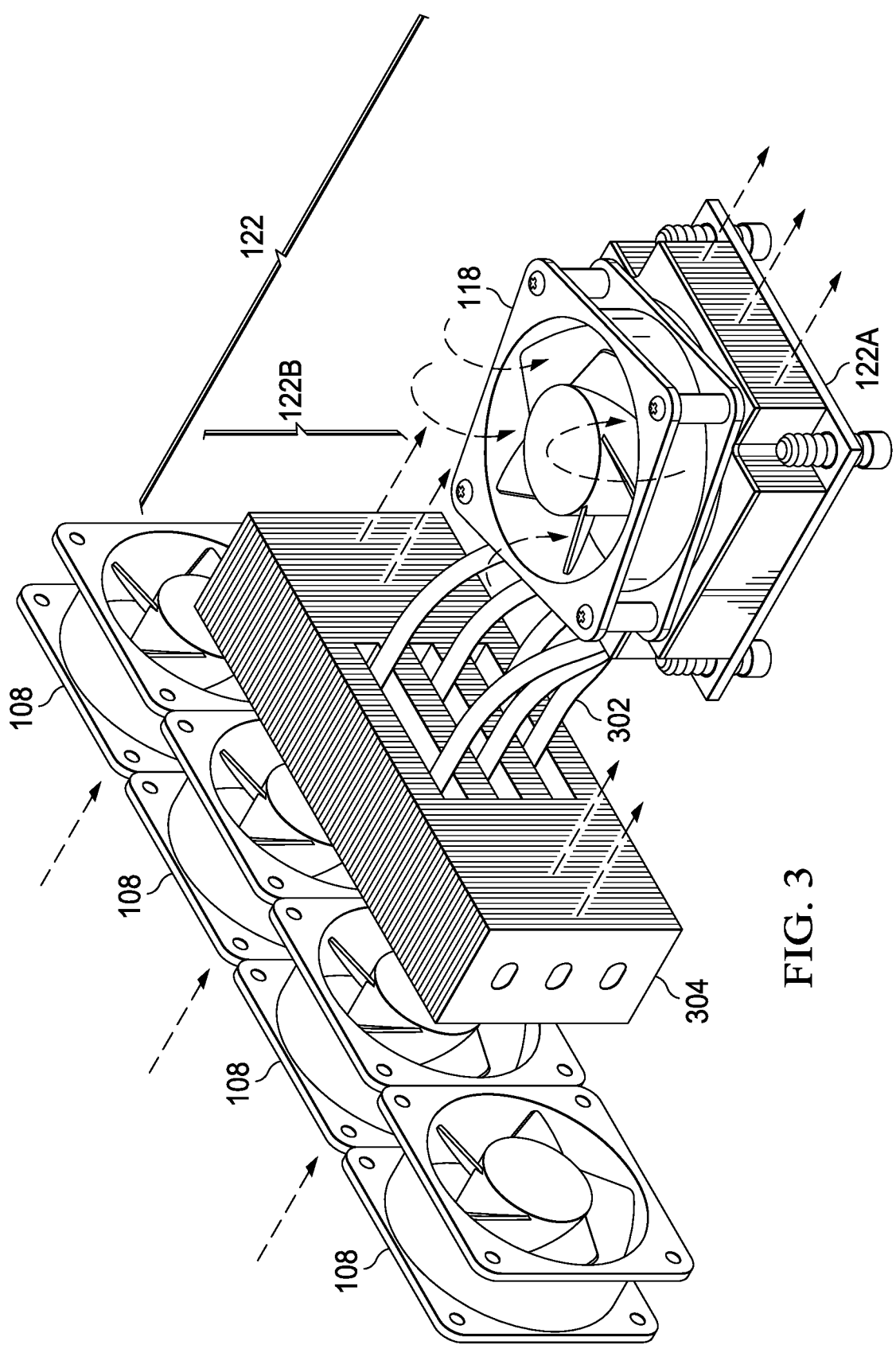
FIG. 3 illustrates a perspective view of selected components of the example information handling system of FIG. 1, in accordance with embodiments of the present disclosure.

FIG. 3 illustrates a perspective view of selected components of the example information handling system 102 of FIG. 1, in accordance with embodiments of the present disclosure. In particular, FIG. 3 depicts heat-rejecting media of 122 as a combination of active heat-rejecting media 122A thermally interfaced between local air mover 118 and device 116 (not explicitly shown in FIG. 3), with passive heat-rejecting media 122B extending from active heat-rejecting media 122A. Active heat-rejecting media 122A may be thermally coupled to device 116 and in some embodiments, have a two-dimensional footprint approximately equivalent to that of device 116, and passive heat-rejecting media 122B may extend outside of such two-dimensional footprint. Passive heat-rejecting media 122B may be thermally coupled to device 116 either directly or via active heat-rejecting media 122A. As shown in FIG. 3, passive heat-rejecting media 122B may be thermally interfaced between system air movers 108 and device 116 and arranged such that heat transferred from device 116 to passive heat-rejecting media 122B is transferred to airflow generated by air movers 108. In some embodiments, passive heat-rejecting media 122B may be formed with one or more heat pipes 302 thermally coupled to and extending from device 116 and/or active heat-rejecting media 122A and with a heatsink 304 thermally coupled to heat pipes 302 and having features (e.g., fins) that are arranged with respect to air movers 108 in order to maximize a surface area of heatsink 304 upon which airflow from air movers 108 will impinge, maximizing heat transfer from passive heat-rejecting media 122B to such airflow.

Figure 4:
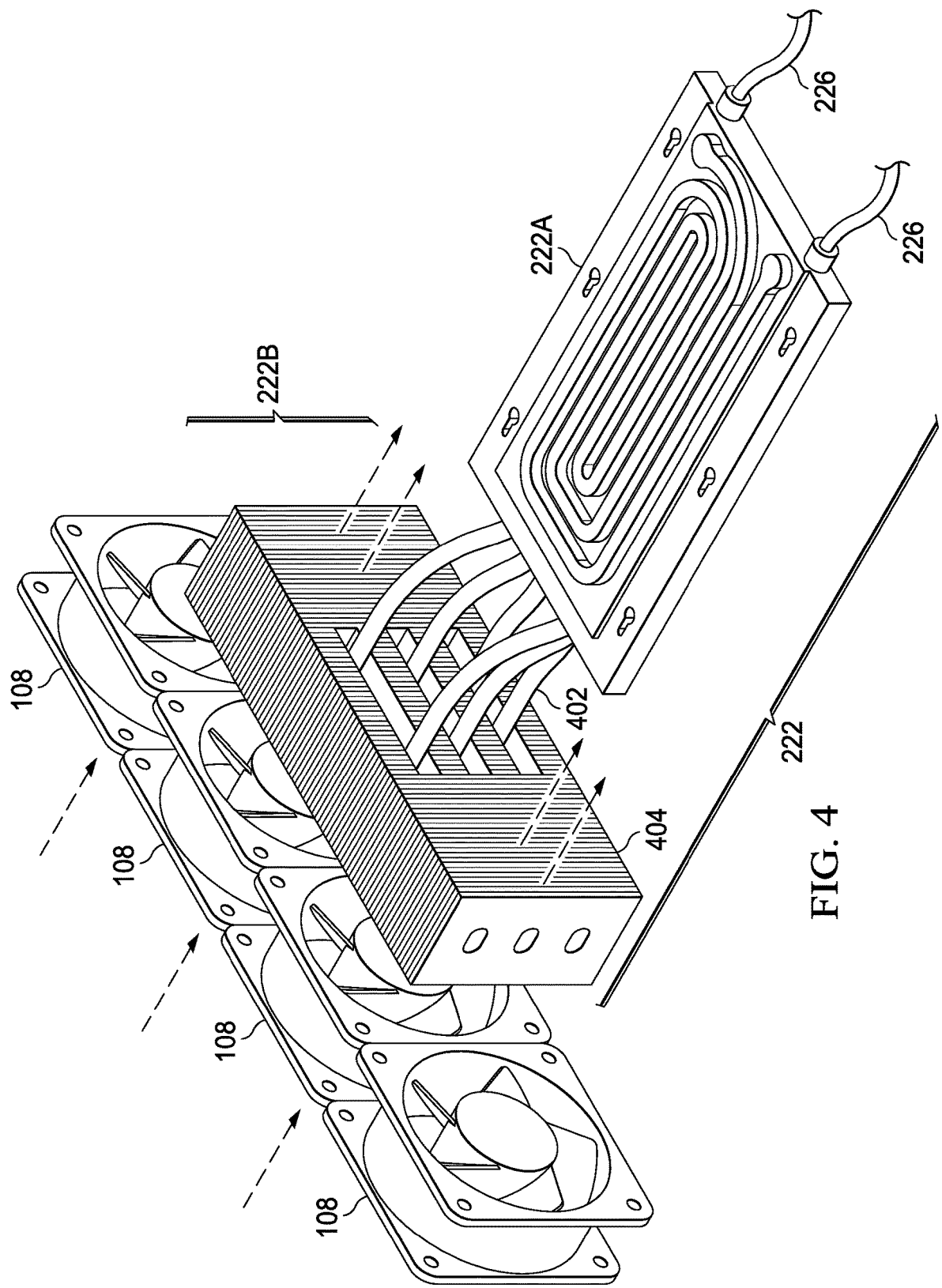
FIG. 4 illustrates a perspective view of selected components of the example information handling system of FIG. 2, in accordance with embodiments of the present disclosure.

FIG. 4 illustrates a perspective view of selected components of the example information handling system 202 of FIG. 2, in accordance with embodiments of the present disclosure. In particular, FIG. 4 depicts heat-rejecting media of 222 as a combination of active heat-rejecting media 222A thermally coupled to device 216 (not explicitly shown in FIG. 4), with passive heat-rejecting media 222B extending from active heat-rejecting media 222A. Active heat-rejecting media 222A may be thermally coupled to device 216 and in some embodiments, have a two-dimensional footprint approximately equivalent to that of device 216, and passive heat-rejecting media 222B may extend outside of such two-dimensional footprint. Passive heat-rejecting media 222B may be thermally coupled to device 216 either directly or via active heat-rejecting media 222A. As shown in FIG. 4, passive heat-rejecting media 222B may be thermally interfaced between system air movers 208 and device 216 and arranged such that heat transferred from device 216 to passive heat-rejecting media 222B is transferred to airflow generated by air movers 208. In some embodiments, passive heat-rejecting media 222B may be formed with one or more heat pipes 402 thermally coupled to and extending from device 216 and/or active heat-rejecting media 222A and with a heatsink 404 thermally coupled to heat pipes 302 and having features (e.g., fins) that are arranged with respect to air movers 208 in order to maximize a surface area of heatsink 404 upon which airflow from air movers 208 will impinge, maximizing heat transfer from passive heat-rejecting media 222B to such airflow.

Figure 5:
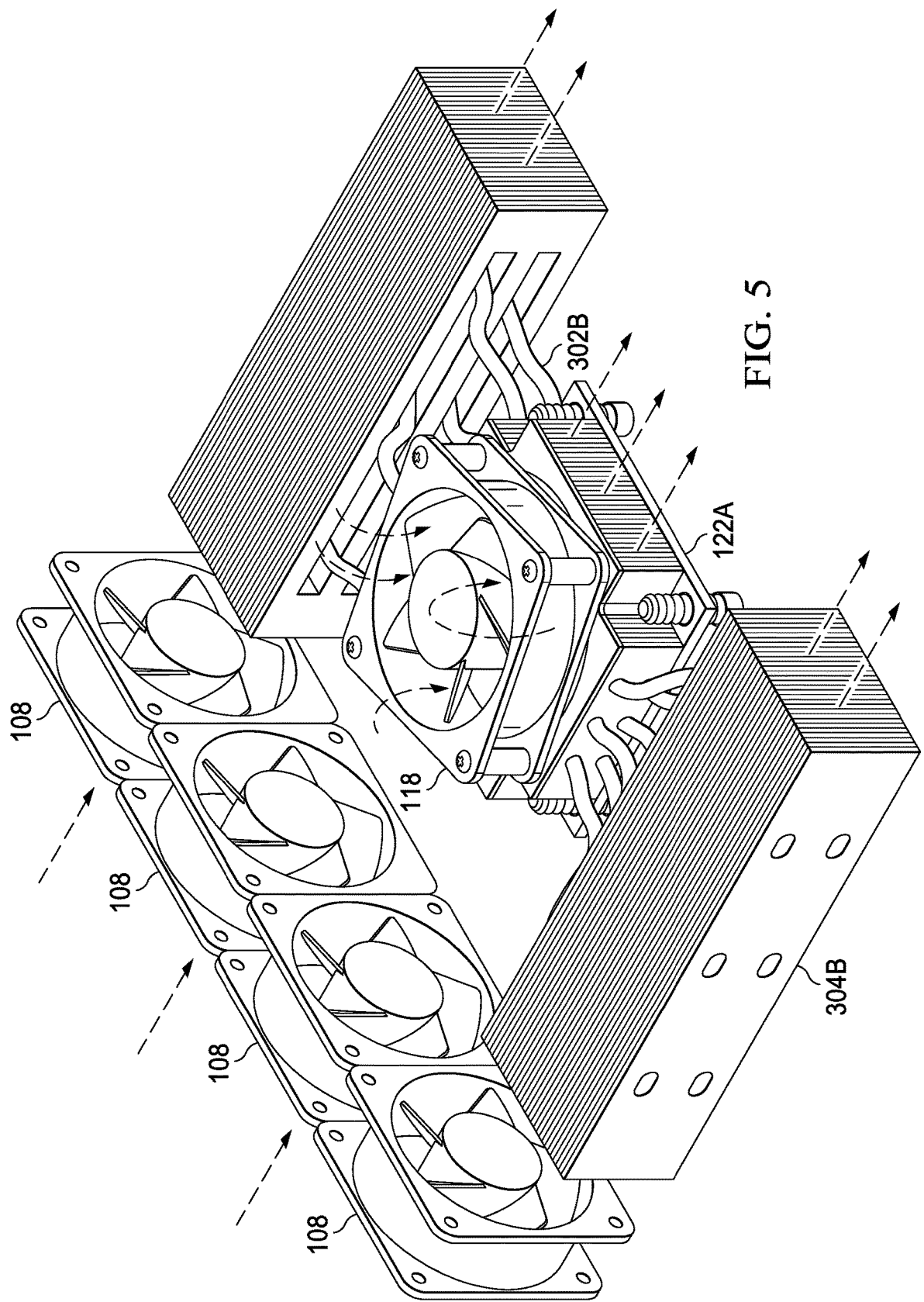
FIG. 5 illustrates an alternative arrangement of selected components of the example information handling system of FIG. 1, in accordance with embodiments of the present disclosure.

FIG. 5 illustrates an alternative arrangement of selected components of the example information handling system of FIG. 1, in accordance with embodiments of the present disclosure. FIG. 5 may be identical in all material respects to FIG. 3, except that heat pipes 302B are placed in lieu of heat pipes 302 and heatsink 304B is placed in lieu of heatsink 304. As shown in FIG. 5, heat pipes 302B extend from opposite sides of heatsink 112A (instead of the side of heatsink 122A closest to heatsink 304) and are shaped to allow heatsink 122A to be closer to heatsink 304B relative to the distance between heatsink 122A and heatsink 304 in FIG. 3. Thus, the arrangement shown in FIG. 5 may be preferable in embodiments in which a shallower physical depth is desired for information handling system 102.

Figure 6:
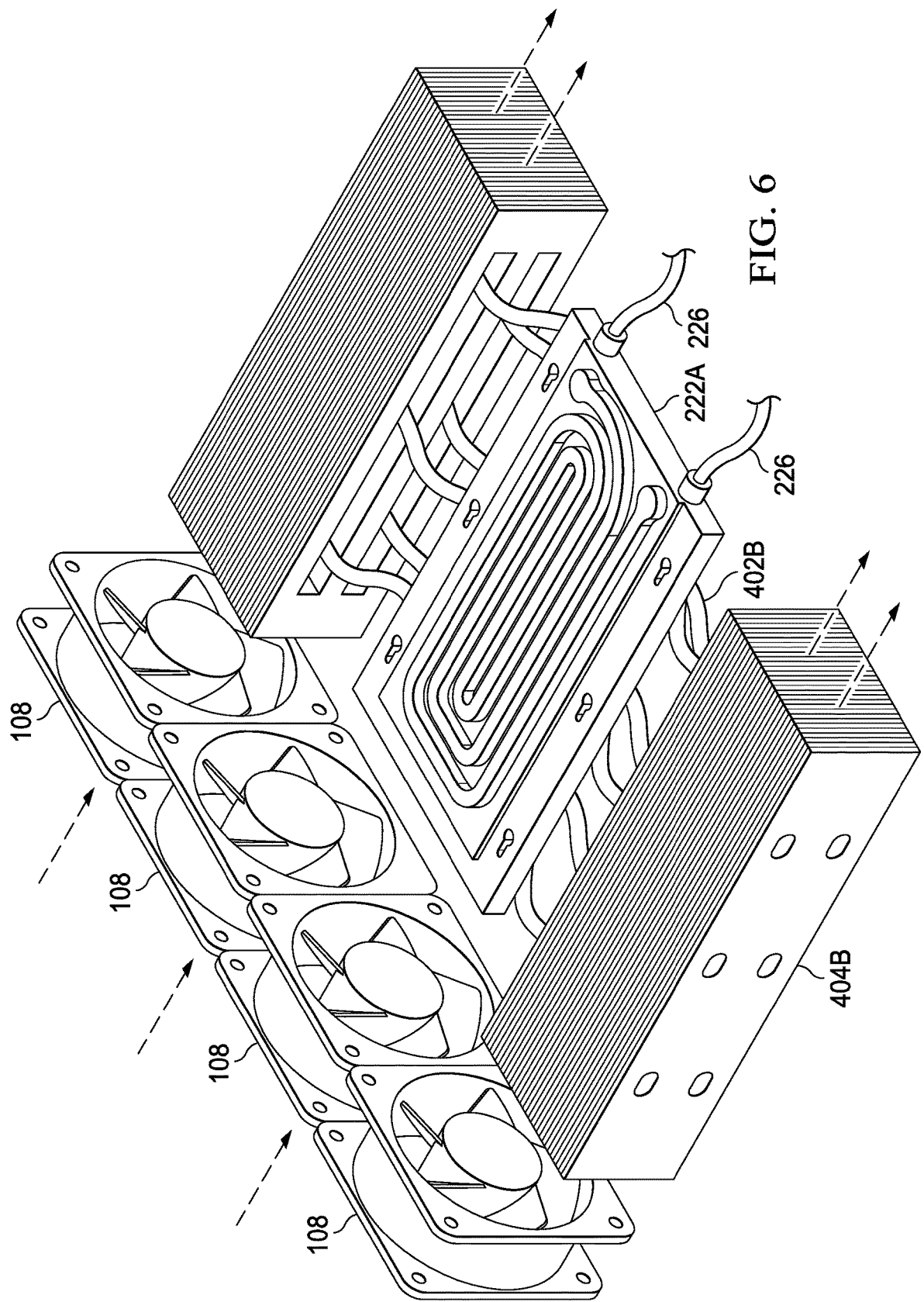
FIG. 6 illustrates an alternative arrangement of selected components of the example information handling system of FIG. 2, in accordance with embodiments of the present disclosure.

FIG. 6 illustrates an alternative arrangement of selected components of the example information handling system of FIG. 2, in accordance with embodiments of the present disclosure. FIG. 6 may be identical in all material respects to FIG. 4, except that heat pipes 402B are placed in lieu of heat pipes 402 and heatsink 404B is placed in lieu of heatsink 404. As shown in FIG. 6, heat pipes 402B extend from opposite sides of heatsink 112B (instead of the side of heatsink 122B closest to heatsink 404) and are shaped to allow heatsink 122B to be closer to heatsink 404B relative to the distance between heatsink 122B and heatsink 404 in FIG. 4. Thus, the arrangement shown in FIG. 6 may be preferable in embodiments in which a shallower physical depth is desired for information handling system 102.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
    a system-level air mover configured to drive airflow to a plurality of components of the information handling system;
    an information handling resource; and
    heat-rejecting media thermally coupled to the information handling resource, the heat-rejecting media comprising:
        active heat-rejecting media comprising a heatsink thermally coupled to the information handling resource and a local air mover mechanically coupled directly to the heatsink; and
        passive heat-rejecting media extending from the active heat-rejecting media and thermally coupled to the active heat-rejecting media via one or more heat pipes, wherein the passive heat-rejecting media does not have an air mover mechanically coupled directly thereto, and wherein the passive heat-rejecting media is downstream of the system-level air mover and configured to be cooled by the airflow driven by the system-level air movers;
        wherein the system-level air mover is configured to drive airflow to both the active heat-rejecting media and the passive heat-rejecting media, and wherein the active heat-rejecting media is downstream of the passive heat-rejecting media in the airflow driven by the system-level air mover.

2. The information handling system of claim 1, wherein the active heat-rejecting media has a two-dimensional footprint equivalent to that of the information handling resource, and wherein the passive heat-rejecting media extends outside the two-dimensional footprint.

3. The information handling system of claim 1, wherein the passive heat-rejecting media is arranged with respect to the system-level air mover in order to maximize surface area of the passive heat-rejecting media upon which airflow generated by the system-level air mover impinges.

4. Heat-rejecting media configured to be thermally coupled to an information handling resource, the heat-rejecting media comprising:
    active heat-rejecting media comprising a heatsink configured to thermally couple to the information handling resource and further comprising a local air mover mechanically coupled directly to the heatsink; and
    passive heat-rejecting media extending from the active heat-rejecting media and thermally coupled to the active heat-rejecting media via one or more heat pipes, wherein the passive heat-rejecting media does not have an air mover mechanically coupled directly thereto, and wherein the passive heat-rejecting media is downstream of a system-level air mover that is configured to drive airflow to a plurality of components of an information handling system comprising the information handling resource, the passive heat-rejecting media configured to be cooled by the airflow driven by the system-level air mover, wherein the system-level air mover is configured to drive airflow to both the active heat-rejecting media and the passive heat-rejecting media, and wherein the active heat-rejecting media is downstream of the passive heat-rejecting media in the airflow driven by the system-level air mover.

5. The heat-rejecting media of claim 4, wherein the active heat-rejecting media has a two-dimensional footprint equivalent to that of the information handling resource, and wherein the passive heat-rejecting media extends outside the two-dimensional footprint.

6. The heat-rejecting media of claim 4, wherein the passive heat-rejecting media is arranged with respect to the system-level air mover in order to maximize surface area of the passive heat-rejecting media upon which airflow generated by the system-level air mover impinges.

7. A method for forming heat-rejecting media configured to be thermally coupled to an information handling resource, the method comprising:
    thermally coupling active heat-rejecting media comprising a heatsink and a local air mover mechanically coupled directly to the heatsink to passive heat-rejecting media via one or more heat pipes, such that:
        the active heat-rejecting media is configured to thermally couple to the information handling resource; and
        the passive heat-rejecting media extends from the active heat-rejecting media, wherein the passive heat-rejecting media does not have an air mover mechanically coupled directly thereto, and wherein the passive heat-rejecting media is downstream of a system-level air mover that is configured to drive airflow to a plurality of components of an information handling system comprising the information handling resource, the passive heat-rejecting media configured to be cooled by the airflow driven by the system-level air mover, wherein the system-level air mover is configured to drive airflow to both the active heat-rejecting media and the passive heat-rejecting media, and wherein the active heat-rejecting media is downstream of the passive heat-rejecting media in the airflow driven by the system-level air mover.

8. The method of claim 7, further comprising forming the active heat-rejecting media to have a two-dimensional footprint equivalent to that of the information handling resource, wherein the passive heat-rejecting media extends outside the two-dimensional footprint.

9. The method of claim 7, further comprising arranging the passive heat-rejecting media with respect to the system-level air mover in order to maximize surface area of the passive heat-rejecting media upon which airflow generated by the system-level air mover impinges.

* * * * *